(12) United States Patent
Shedletsky et al.

(10) Patent No.: US 9,084,357 B2
(45) Date of Patent: Jul. 14, 2015

(54) SYSTEMS AND METHODS FOR ROUTING CABLES IN AN ELECTRONIC DEVICE

(75) Inventors: Anna-Katrina Shedletsky, Sunnyvale, CA (US); Christopher M. Werner, San Jose, CA (US); Colin M. Ely, Cupertino, CA (US); Fletcher R. Rothkopf, Mountain View, CA (US); Ming Leong, Cupertino, CA (US); Phillip Michael Hobson, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 166 days.

(21) Appl. No.: 13/610,734

(22) Filed: Sep. 11, 2012

(65) Prior Publication Data

US 2014/0071081 A1    Mar. 13, 2014

(51) Int. Cl.
| | |
|---|---|
| G06F 3/047 | (2006.01) |
| H05K 7/06 | (2006.01) |
| H01R 43/00 | (2006.01) |
| G06F 1/16 | (2006.01) |
| G06F 1/18 | (2006.01) |
| H04M 1/02 | (2006.01) |

(52) U.S. Cl.
CPC ............... *H05K 7/06* (2013.01); *G06F 1/1643* (2013.01); *G06F 1/1658* (2013.01); *G06F 1/18* (2013.01); *G06F 3/047* (2013.01); *H01R 43/00* (2013.01); *H04M 1/0274* (2013.01); *H04M 1/0266* (2013.01); *H04M 2250/22* (2013.01); *Y10T 29/49169* (2015.01)

(58) Field of Classification Search
None
See application file for complete search history.

(56) References Cited

U.S. PATENT DOCUMENTS

| | | | |
|---|---|---|---|
| 2008/0007539 A1* | 1/2008 | Hotelling | 345/173 |
| 2008/0062148 A1 | 3/2008 | Hotelling et al. | |
| 2008/0158181 A1 | 7/2008 | Hamblin et al. | |
| 2011/0164371 A1* | 7/2011 | McClure et al. | 361/679.26 |
| 2011/0279405 A1* | 11/2011 | Meng | 345/174 |

\* cited by examiner

*Primary Examiner* — Nicholas Lee
*Assistant Examiner* — Duane N Taylor, Jr.
(74) *Attorney, Agent, or Firm* — Kendall P. Woodruff

(57) ABSTRACT

Systems and methods for routing cables in an electronic device are provided. In some embodiments, the electronic device may include a touch sensor having a number of traces, a display component, and a mechanical button, each of which may be coupled to a circuit board via a single flexible circuit cable. This may save valuable space within the electronic device.

24 Claims, 10 Drawing Sheets

900

ELECTRICALLY COUPLING A FIRST BOND PAD OF A
CABLE TO AT LEAST ONE ELECTRICAL CONTACT OF A
CAPACITIVE TOUCH INPUT ASSEMBLY
902

↓

ELECTRICALLY COUPLING A SECOND BOND PAD OF THE
CABLE TO AT LEAST ONE ELECTRICAL CONTACT OF A
MECHANICAL INPUT ASSEMBLY
904

↓

ELECTRICALLY COUPLING THE FIRST BOND PAD
AND THE SECOND BOND PAD TO A CONNECTOR
AT AN END REGION OF THE CABLE
906

FIG. 9

SYSTEMS AND METHODS FOR ROUTING CABLES IN AN ELECTRONIC DEVICE

FIELD OF THE INVENTION

This can relate to systems and methods for routing cables in an electronic device.

BACKGROUND OF THE DISCLOSURE

Some electronic devices include a cable that may be routed within an electronic device for electrically coupling together two components of the device. However, using a cable to couple together only two components often takes up valuable real estate within the device when more than those two components of the device require coupling.

SUMMARY OF THE DISCLOSURE

Systems and methods for routing cables in an electronic device are provided.

In some embodiments, there may be provided an electronic device that may include a first component comprising a number of traces along a substrate, a second component, and a cable that may include a first bond pad electrically coupled to a first set of the traces, a second bond pad electrically coupled to a second set of the traces, a third bond pad electrically coupled to a third set of the traces, a fourth bond pad electrically coupled to the second component, and a connector electrically coupled to each one of the first bond pad, the second bond pad, the third bond pad, and the fourth bond pad.

In other embodiments, there may be provided an electronic device that may include a display assembly for displaying data on an active display area defined by at least a first edge and a second edge opposite the first edge. The device may also include a touch assembly having a number of traces on a substrate. The device may also include a first cable having a first bond pad electrically coupled to at least a first set of the traces and a first connector electrically coupled to the first bond pad. The device may also include a second cable having a second bond pad electrically coupled to a component of the display assembly and a second connector electrically coupled to the second bond pad. The first bond pad may be positioned beyond the first edge of the active display area, and the second bond pad may be positioned beyond the second edge of the active display area.

In yet other embodiments, there may be provided a method that includes electrically coupling a first bond pad of a cable to at least one electrical contact of a capacitive touch input assembly, electrically coupling a second bond pad of the cable to at least one electrical contact of a mechanical input assembly, and electrically coupling the first bond pad and the second bond pad to a connector at an end region of the cable.

In still yet other embodiments, there may be provided a method that includes providing a display assembly that displays data on an active display area defined by at least a first edge and a second edge opposite the first edge, providing a touch assembly comprising a number of traces on a substrate, electrically coupling a first bond pad of a first cable to an end of a first trace of the traces at a first position beyond the first edge of the active display area, and electrically coupling a second bond pad of a second cable to a component of the display assembly at a second position beyond the second edge of the active display area.

BRIEF DESCRIPTION OF THE DRAWINGS

The above and other aspects of the invention, its nature, and various features will become more apparent upon consideration of the following detailed description, taken in conjunction with the accompanying drawings, in which like reference characters may refer to like parts throughout, and in which:

FIG. 9 is a flowchart of an illustrative process for routing at least one cable, in accordance with some embodiments of the invention.

DETAILED DESCRIPTION OF THE DISCLOSURE

Systems and methods for routing cables in an electronic device are provided and described with reference to FIGS. 1-10.

Figure 1:
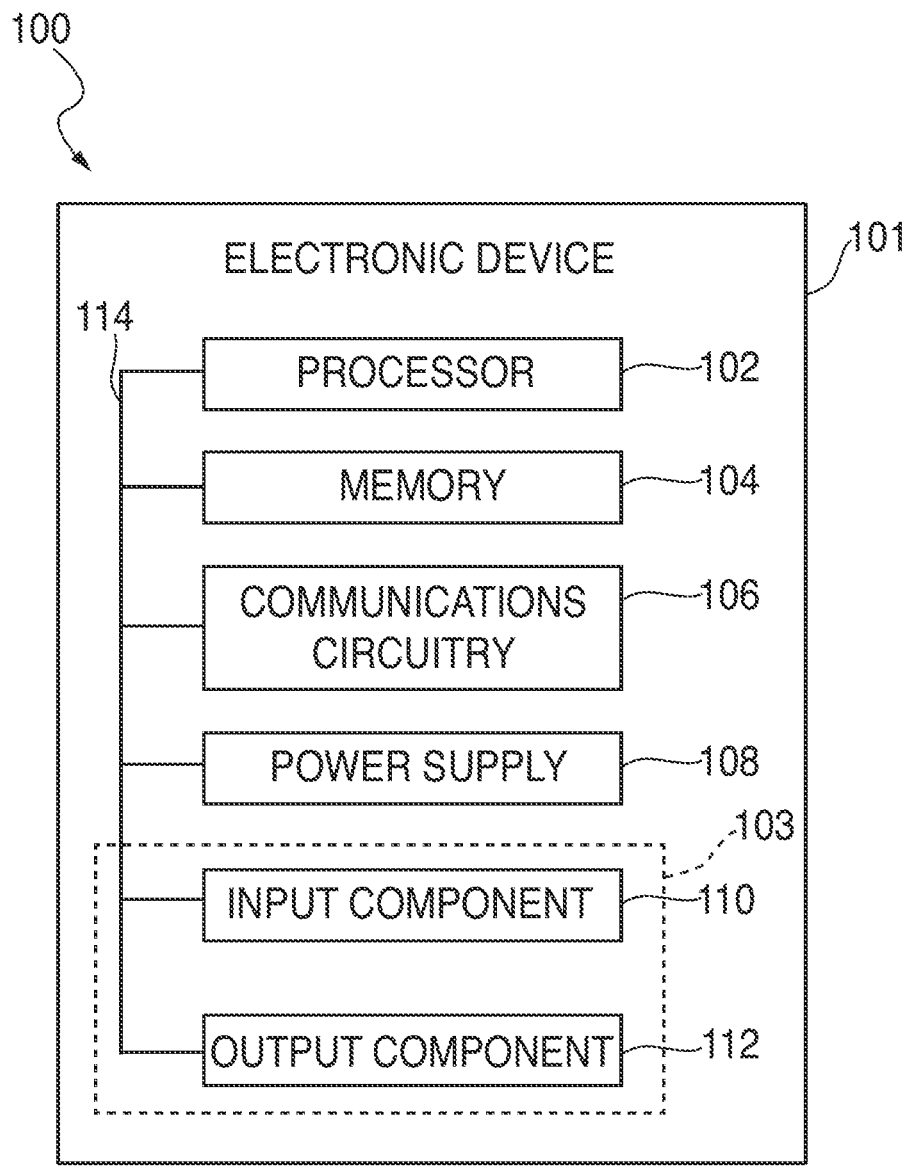
FIG. 1 is a schematic view of an illustrative electronic device, in accordance with some embodiments of the invention.

FIG. 1 is a schematic view of an illustrative electronic device 100 in accordance with some embodiments of the invention. Electronic device 100 may be any portable, mobile, or hand-held electronic device. Alternatively, electronic device 100 may not be portable, but may instead be generally stationary. Electronic device 100 can include, but is not limited to, a music player (e.g., an iPod™ available by Apple Inc. of Cupertino, Calif.), video player, still image player, game player, other media player, music recorder, movie or video camera or recorder, still camera, other media recorder, radio, medical equipment, domestic appliance, transportation vehicle instrument, musical instrument, calculator, cellular telephone (e.g., an iPhone™ available by Apple Inc.), other wireless communication device, personal digital assistant, remote control, pager, computer (e.g., a desktop, laptop, server, etc.), tablet, monitor, television, stereo equipment, set up box, set-top box, boom box, modem, router, printer, and combinations thereof. In some cases, electronic device 100 may perform a single function (e.g., an electronic device dedicated to capturing images) and in other cases, electronic device 100 may perform several functions (e.g., an electronic device that captures images, plays music, displays video, stores pictures, and receives and transmits telephone calls). In some embodiments, electronic device 100 may be considered a miniature electronic device that may have a form factor that is smaller than that of hand-held electronic devices, such as an iPod™ available by Apple Inc. of Cupertino, Calif. Illustrative miniature electronic devices can be integrated into various objects that include, but are not limited to, watches, rings, necklaces, belts, accessories for belts, headsets, accessories for shoes, virtual reality devices, other wearable electronics, accessories for sporting equipment, accessories for fitness equipment, key chains, or any combination thereof.

Electronic device 100 may include a processor or control circuitry 102, memory 104, communications circuitry 106, power supply 108, input component 110, and output component 112. Electronic device 100 may also include a bus 114 that may provide one or more wired or wireless communication links or paths for transferring data and/or power to, from, or between various other components of device 100. In some embodiments, one or more components of electronic device 100 may be combined or omitted. Moreover, electronic device 100 may include other components not combined or included in FIG. 1. For example, electronic device 100 may include motion-sensing circuitry, a compass, positioning circuitry, or several instances of the components shown in FIG. 1. For the sake of simplicity, only one of each of the components is shown in FIG. 1.

Memory 104 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 104 may include cache memory, which may be one or more different types of memory used for temporarily storing data for electronic device applications. Memory 104 may store media data (e.g., music and image files), software (e.g., for implementing functions on device 100), firmware, preference information (e.g., media playback preferences), lifestyle information (e.g., food preferences), exercise information (e.g., information obtained by exercise monitoring equipment), transaction information (e.g., information such as credit card information), wireless connection information (e.g., information that may enable device 100 to establish a wireless connection), subscription information (e.g., information that keeps track of podcasts or television shows or other media a user subscribes to), contact information (e.g., telephone numbers and e-mail addresses), calendar information, any other suitable data, or any combination thereof.

Communications circuitry 106 may be provided to allow device 100 to communicate with one or more other electronic devices using any suitable communications protocol. For example, communications circuitry 106 may support Wi-Fi (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, or any combination thereof. Communications circuitry 106 may also include circuitry that can enable device 100 to be electrically coupled to another device (e.g., a host computer or an accessory device) and communicate with that other device, either wirelessly or via a wired connection.

Power supply 108 may provide power to one or more of the components of device 100. In some embodiments, power supply 108 can be coupled to a power grid (e.g., when device 100 is not a portable device, such as a desktop computer). In some embodiments, power supply 108 can include one or more batteries for providing power (e.g., when device 100 is a portable device, such as a cellular telephone). As another example, power supply 108 can be configured to generate power from a natural source (e.g., solar power using solar cells).

One or more input components 110 may be provided to permit a user to interact or interface with device 100. For example, input component 110 can take a variety of forms, including, but not limited to, a touch pad, dial, click wheel, scroll wheel, touch screen, one or more buttons (e.g., a keyboard), mouse, joy stick, track ball, microphone, camera, proximity sensor, light detector, motion sensor, and combinations thereof. Each input component 110 can be configured to provide one or more dedicated control functions for making selections or issuing commands associated with operating device 100.

Electronic device 100 may also include one or more output components 112 that may present information (e.g., graphical, audible, and/or tactile information) to a user of device 100. Output component 112 of electronic device 100 may take various forms, including, but not limited to, an audio speaker, headphone, audio line-out, video line-out, visual display, antenna, infrared port, rumbler, vibrator, and combinations thereof. Each output component 112 can be configured to provide information from one or more other components of device 100 (e.g., processor 102) to a user of device 100.

It should be noted that one or more input components 110 and one or more output components 112 may sometimes be referred to collectively herein as an input/output ("I/O") component or I/O interface. For example, input component 110 and output component 112 may sometimes be a single I/O component 103, such as a touch screen, that may receive input information through a user's touch of a display screen and that may also provide visual information to a user via that same display screen.

Processor 102 of device 100 may include any processing circuitry operative to control the operations and performance of one or more components of electronic device 100. For example, processor 102 may be used to run operating system applications, firmware applications, graphics editing applications, media playback applications, media editing applications, or any other application. In some embodiments, processor 102 may receive input signals from input component 110 and/or drive output signals through output component 112. Processor 102 may load a user interface program (e.g., a program stored in memory 104 or in another device or server accessible by device 100) to determine how instructions or data received via an input component 110 may manipulate the way in which information is stored and/or provided to the user via an output component 112.

Electronic device 100 may also be provided with a housing 101 that may at least partially enclose one or more of the components of device 100 for protection from debris and other degrading forces external to device 100. In some embodiments, one or more of the components may be provided within its own housing (e.g., input component 110 may be an independent keyboard or mouse within its own housing that may wirelessly or through a wire communicate with processor 102, which may be provided within its own housing).

Figure 2:
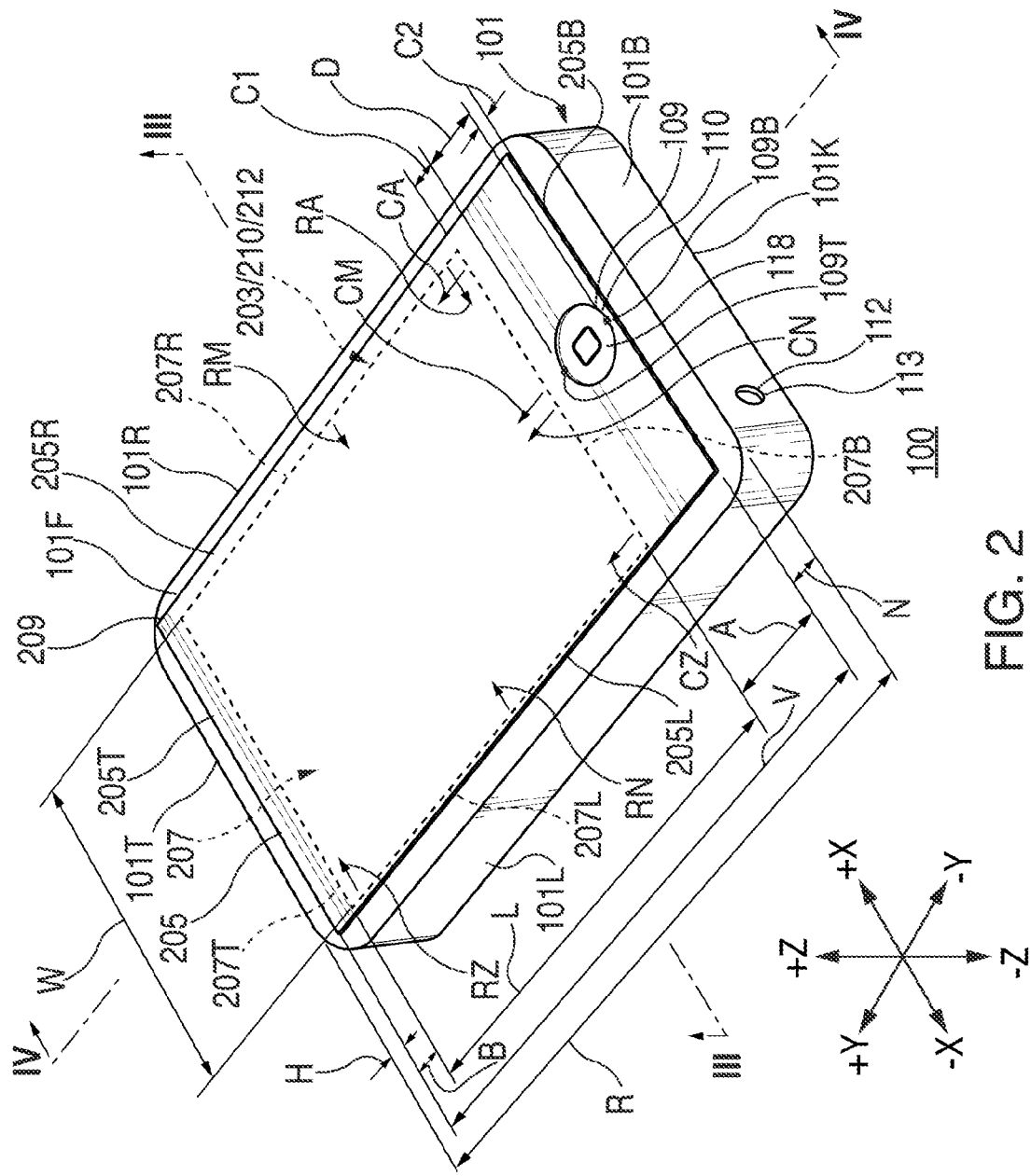
FIG. 2 is a front, bottom, left perspective view of the electronic device of FIG. 1, in a final stage of assembly, in accordance with some embodiments of the invention.

FIG. 2 is a perspective view of a portion of fully assembled electronic device 100 in accordance with some embodiments of the invention. As shown, electronic device 100 can include at least a first input component 110 and a first output component 112. Moreover, as shown, electronic device 100 may also include a second input component 210 and a second output component 212. In some embodiments, second input component 210 and second output component 212 may be an I/O component 203. As shown in FIG. 2, housing 101 may at least partially enclose input component 110, output component 112, and I/O component 203 of device 100. Housing 101 may be any suitable shape and may include any suitable number of walls. In some embodiments, as shown in FIG. 2, for example, housing 101 may be of a generally hexahedral shape and may include a bottom wall 101B, a top wall 101T that may be opposite bottom wall 101B, a left wall 101L, a right wall 101R that may be opposite left wall 101L, a front wall 101F, and a back wall 101K that may be opposite front wall 101F.

As shown in FIG. 2, for example, first input component 110 may be a mechanical button assembly, and first output component 112 may be an audio jack assembly (e.g., for receiving a plug of a headset). Although, it is to be understood that in other embodiments, first input component 110 may be any other suitable type of input component and first output component 112 may be any other suitable type of output component. A cover 205 may be provided within an opening 209, which may be provided through front surface 101F of housing 101, and a button 118 of first input component 110 may be positioned at least partially under or through an opening 109, which may be provided through cover 205. First output component 112 may be positioned at least partially under or through an opening 113, which may be provided through bottom surface 101B of housing 101. Although, in other embodiments, it is to be understood that each one of first input component 110 and second input component 112 may be provided through any other surface of housing 101.

As also shown in FIG. 2, for example, second input component 210 and second output component 212 of I/O component 203 may be a touch screen (e.g., a multi-touch screen), that may receive input information through a user's touch of a display screen and that may also provide visual information to a user via that same display screen. For example, second input component 210 of I/O component 203 may be a touch assembly and second output component 212 of I/O component 203 may be a display assembly, where the display assembly and touch assembly may be integrated with one another and or provided in a stacked configuration (e.g., along the Z-axis). Display output component 212 may include any suitable type of display or interface for presenting visual data to a user. In some embodiments, display output component 212 may include a display embedded in device 100. Display output component 212 may include, for example, a liquid crystal display ("LCD"), a light emitting diode ("LED") display, an organic light-emitting diode ("OLED") display, a surface-conduction electron-emitter display ("SED"), a carbon nanotube display, a nanocrystal display, any other suitable type of display, or combination thereof. In some embodiments, display output component 212 may include display driver circuitry, circuitry for driving display drivers, or both. Display output component 212 can be operative to display content (e.g., media playback information, application screens for applications implemented on electronic device 100, information regarding ongoing communications operations, information regarding incoming communications requests, device operation screens, etc.) that may be under the direction of processor 102. Display output component 212 can be associated with any suitable characteristic dimensions that may define the size and shape of an active display region or viewable screen 207 that may be visible by a user of device 100 through a portion of cover 205. For example, display screen 207 can be shaped as a rectangle that may be defined by a width W provided by a top edge 207T and an opposite bottom edge 207B of screen 207, and by a screen length L provided by a left edge 207L and an opposite right edge 207R of screen 207. In some embodiments, as shown, top edge 207T of screen 207 may run parallel to top surface 101T of housing 101, bottom edge 207B of screen 207 may run parallel to bottom surface 101B of housing 101, left edge 207L of screen 207 may run parallel to left surface 101L of housing 101, and/or right edge 207R of screen 207 may run parallel to right surface 101R of housing 101. Alternatively, display screen 207 can be defined by a curved or other non-polygonal shape (e.g., a circular display).

Similarly, cover 205 can be shaped as a rectangle. For example, as shown, a top edge 205T of cover 205 may run parallel to top surface 101T of housing 101 and/or to top edge 207T of screen 207, a bottom edge 205B of cover 205 may run parallel to bottom surface 101B of housing 101 and/or to bottom edge 207B of screen 207, a left edge 205L of cover 205 may run parallel to left surface 101L of housing 101 and/or to left edge 207L of screen 207, and/or a right edge 205R of cover 205 may run parallel to right surface 101R of housing 101 and/or to right edge 207R of screen 207. Alternatively, cover 205 can be defined by a curved or other non-polygonal shape (e.g., circular). Cover 205 may be formed by any suitable material, such as glass.

Figure 4:
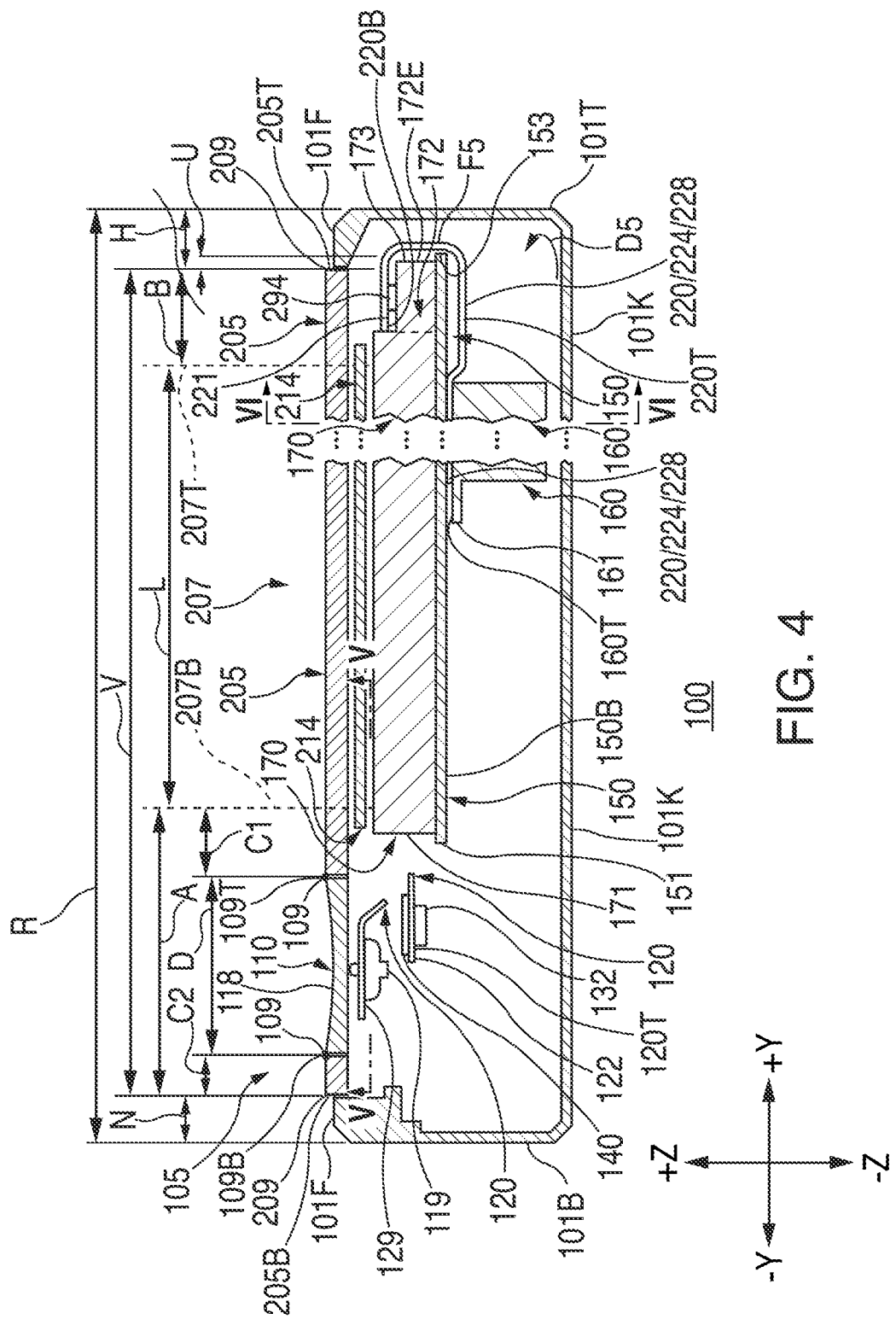
FIG. 4 is a cross-sectional view of the electronic device of FIGS. 1-3, taken from line IV-IV of FIG. 2, in accordance with some embodiments of the invention.

As shown in FIGS. 2 and 4, for example, the size of device 100 may be defined along the Y-axis by an overall housing length R of housing 101 that may extend between top surface 101T and bottom surface 101B. Overall housing length R of device 101 may be defined by three distinct lengths, such as (1) an overall cover length V of cover 205 that may extend between top cover edge 205T and bottom cover edge 205B, (2) a top housing length H of front housing surface 101F that may extend between top housing surface 101T and top cover edge 205T, and (3) a bottom housing length N of front housing surface 101F that may extend between bottom housing surface 101B and bottom cover edge 205B. Moreover, overall cover length V of cover 205 may be defined by three distinct lengths, such as (1) screen length L of screen 207 that may extend between top screen edge 207T and bottom screen edge 207B, (2) a top cover length B that may extend between top cover edge 205T and top screen edge 207T, and (3) a bottom cover length A that may extend between bottom cover edge 205B and bottom screen edge 207B. Finally, bottom cover length A of cover 205 may be defined by three distinct lengths, such as (1) a button length D of opening 109 for button 118, (2) a top button opening length C1 that may extend between bottom screen edge 207B and a top button point 109T of opening 109 (e.g., the point along opening 109 that is furthest in the +Y-direction and/or the closest point to bottom screen edge 207B), and (3) a bottom button opening length C2 that may extend between bottom cover edge 205B and a bottom button point 109B of opening 109 (e.g., the point along opening 109 that is furthest in the −Y-direction and/or the closest point to bottom cover edge 205B, such that the length between points 109A and 109B may define button length D). In order to reduce overall housing length R, at least one of lengths V, H, N, L, B, A, D, C1, and C2 must be reduced. In some embodiments, as described below, one or more ways in which one or more cables may be routed through device 100 may reduce one or more of these lengths.

In some embodiments, as shown in FIGS. 3-8, for example, electronic device 100 may include a system for routing a cable within housing 101 and amongst various components of device 100. As shown, device 100 may include at least one electrically conducting cable 120 that may provide an electrical connection between two or more electronic components of electronic device 100. For example, cable 120 may include one or more wires and may be any suitable type of connector or cable, including, but not limited to, a flexible circuit cable (e.g., a "flex" cable), a coaxial cable (e.g., a "coax" cable), a multi-core cable, a shielded cable, a single cable, a twisted pair cable, a twisting cable, and the like, which may route one or more electrical signals from at least a first electrical component of device 100 to at least a second electrical component of device 100. In some embodiments, cable 120 may be a flexible circuit of any suitable type, such as any flexible printed circuit ("FPC") or any flexible flat cable ("FFC"), including one-sided, double-sided, multi-layer, dual access, rigid-flex, or combinations thereof.

As shown in FIGS. 3-8, for example, cable 120 may include a cable body 124 that may extend between a first end region 122 and one or more bond pad regions (e.g., a first bond pad region 121, a second bond pad region 123, a third bond pad region 125, a fourth bond pad region 127, and a fifth bond pad region 129). Cable 120 may include a top surface 120T and a bottom surface 120B. Cable body 124 may have a first cable body portion 126 (e.g., a snake body portion 126) and a second cable body region 128. First cable body region 126 may extend between first end region 122 and second cable body region 128, while second cable body region 128 may extend between first cable body region 126 and each one of the bond pad regions (e.g., each one of first bond pad region 121, second bond pad region 123, third bond pad region 125, fourth bond pad region 127, and fifth bond pad region 129). Cable body 124 may also include any number of electrically conductive traces, vias, or wires (not shown) extending therealong between top surface 120T and bottom surface 120B, where a first subset of the traces may extend from first end region 122 to first bond pad region 121, a second subset of the traces may extend from first end region 122 to second bond pad region 123, a third subset of the traces may extend from first end region 122 to third bond pad region 125, a fourth subset of the traces may extend from first end region 122 to fourth bond pad region 127, and a fifth subset of the traces may extend from first end region 122 to fifth bond pad region 129. A connector 132 may be provided on top surface 120T at first end region 122, such that a first end of each of the traces of cable 120 at first end region 122 (e.g., the traces of each one of the subsets of traces) may be electrically coupled via connector 132 to one or more other components of device 100 (e.g., a circuit board or processor 102). For example, connector 132 may be any suitable type of connector, including, but not limited to, a board to board connector, a zero insertion force ("ZIF") connector, a hand or robot solder pad, an anisotropic conductive film ("ACF") bond, and combinations thereof.

Figure 5:
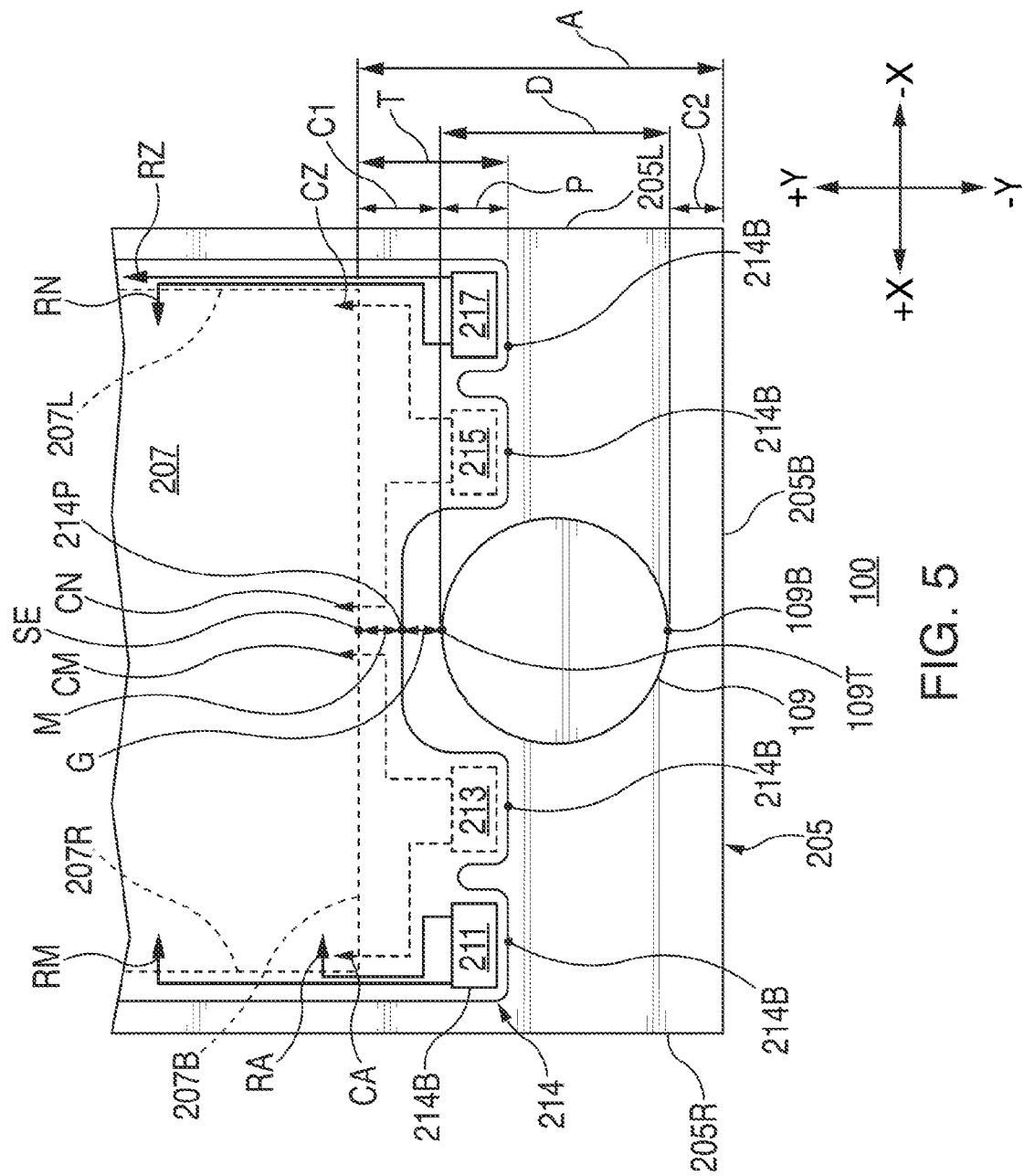
FIG. 5 is a bottom view of a portion of the electronic device of FIGS. 1-4, taken from line V-V of FIG. 4, in accordance with some embodiments of the invention.
Figure 6:
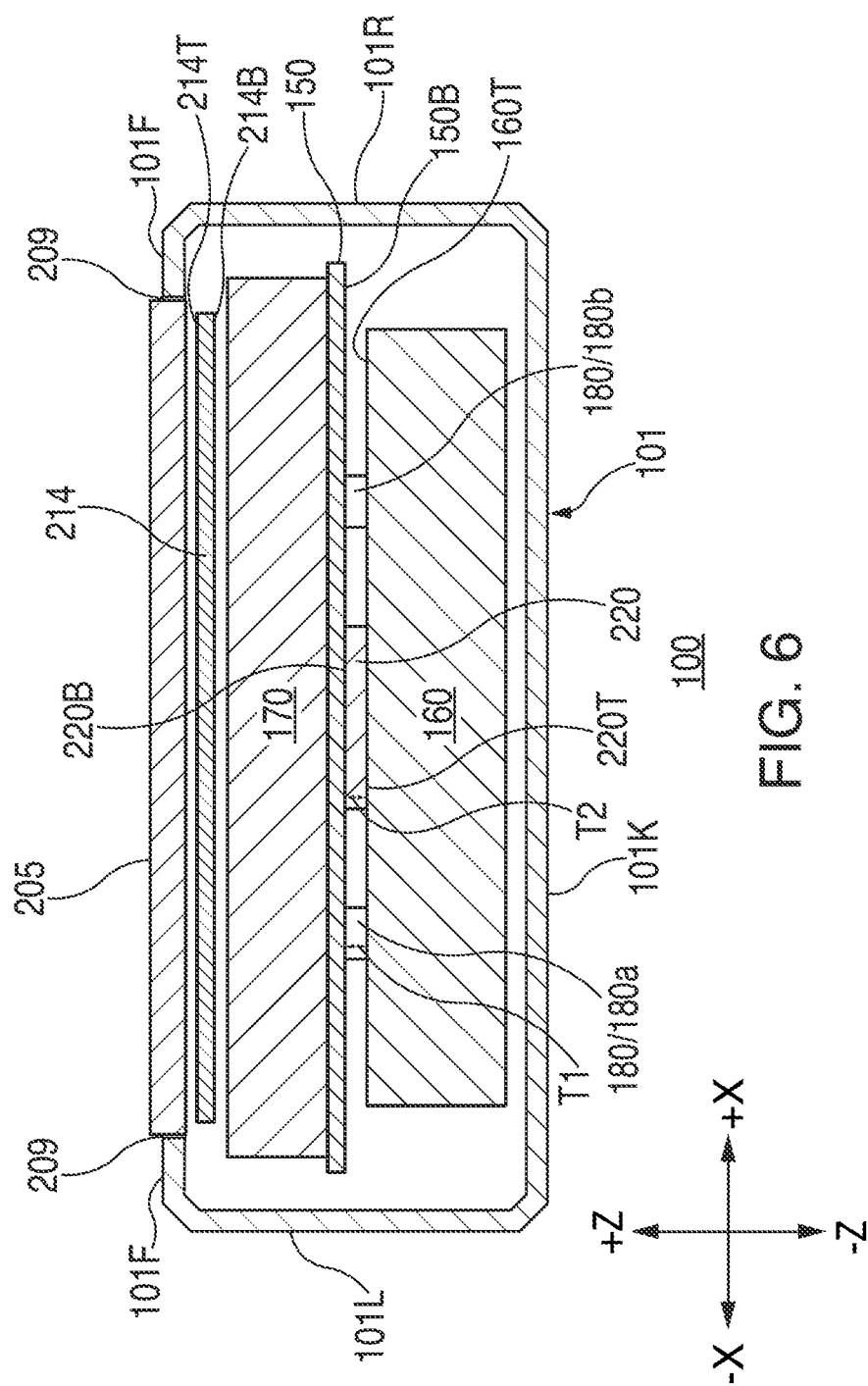
FIG. 6 is a cross-sectional view of the electronic device of FIGS. 1-5, taken from line VI-VI of FIG. 4, in accordance with some embodiments of the invention.
Figure 7:
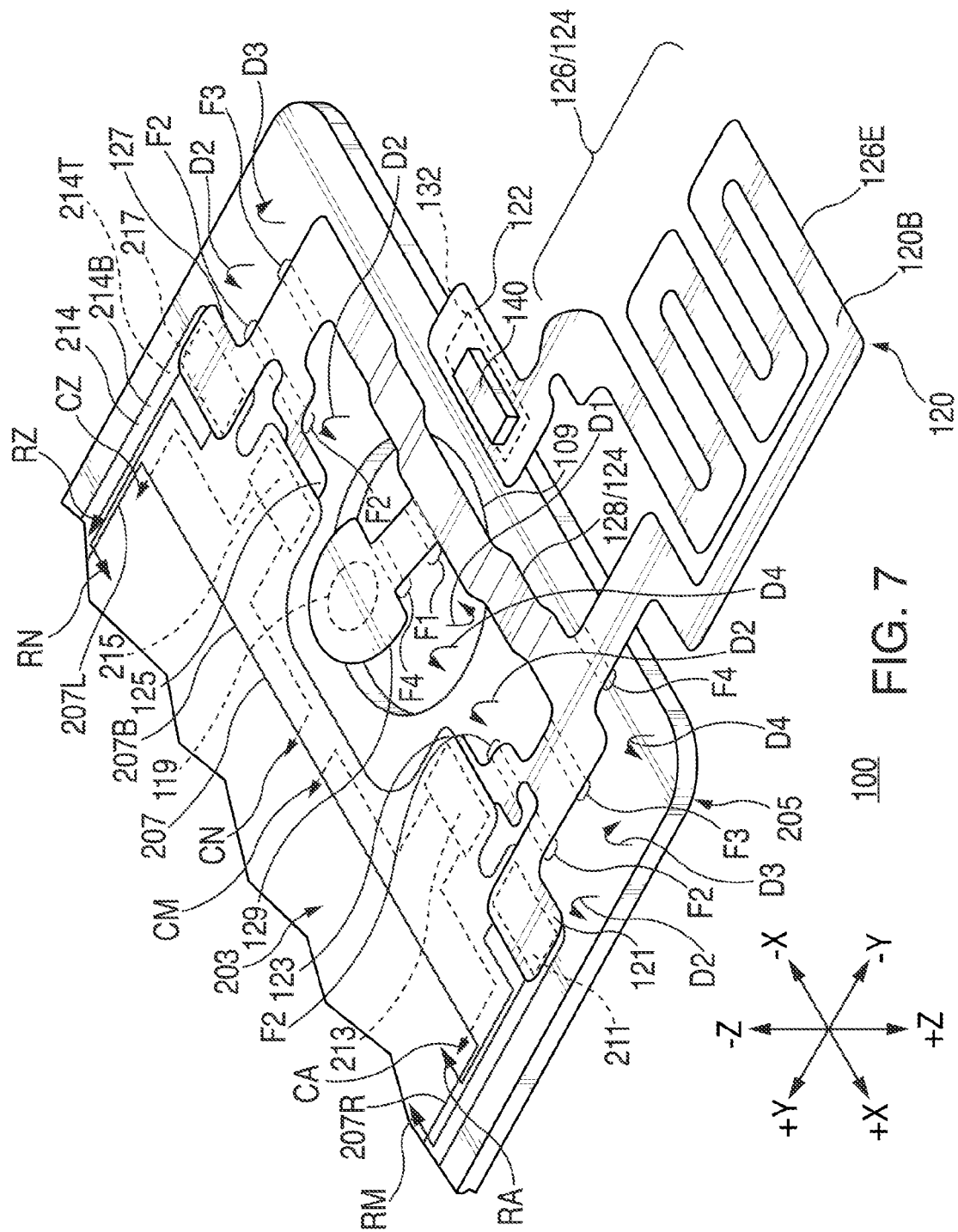
FIG. 7 is a back, bottom, right perspective view, similar to FIG. 3, of a portion of the electronic device of FIGS. 1-6, in a first stage of assembly, in accordance with some embodiments of the invention.
Figure 8:
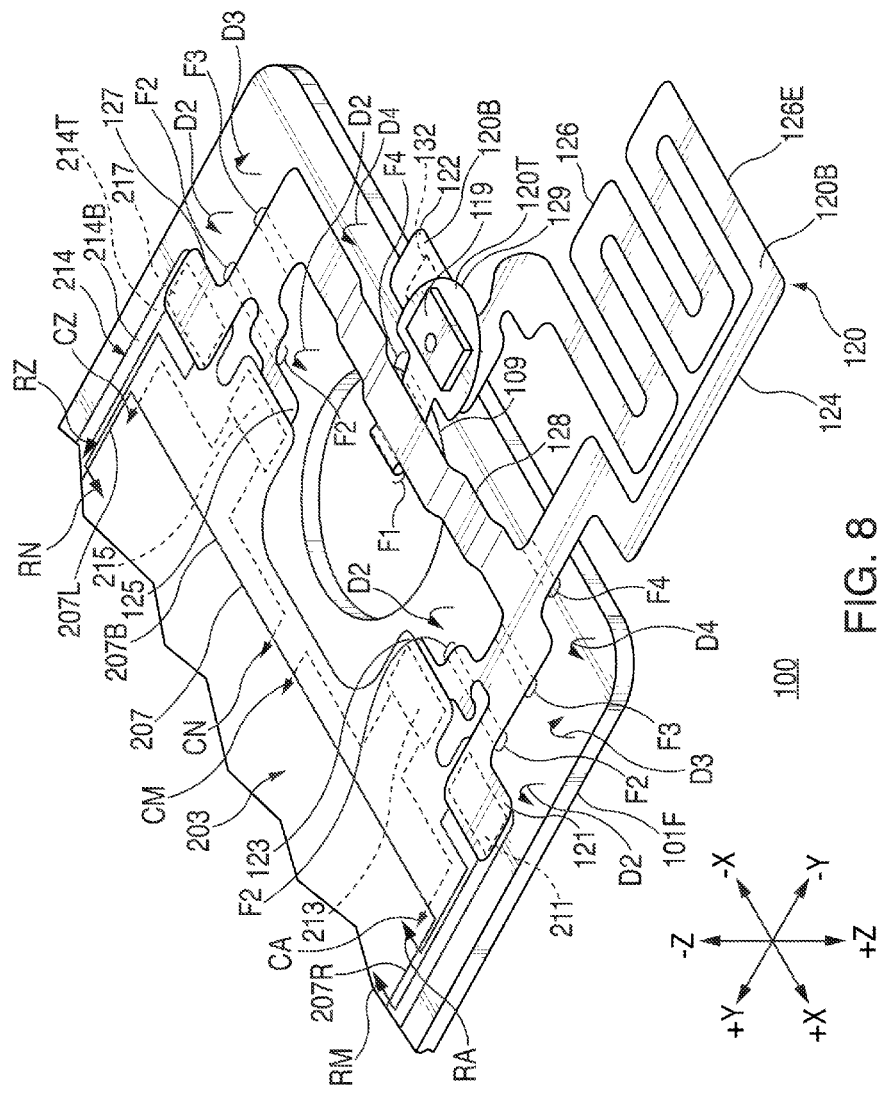
FIG. 8 is a back, bottom, right perspective view, similar to FIG. 7, of a portion of the electronic device of FIGS. 1-7, in a second stage of assembly, in accordance with some embodiments of the invention.

As also shown in FIGS. 3-8, for example, input component 210 of touch screen I/O component 203 may be a touch sensor panel or touch sensor assembly that may include a touch sensor 214. Touch sensor 214 may include any suitable sensor configured to detect one or more touch events for touch screen I/O component 203, such as a double sided Indium Tin Oxide ("DITO") sensor substrate (e.g., as may be described in commonly-assigned U.S. Patent Application Publication No. 2008/0158181, which is hereby incorporated by reference herein in its entirety), a single sided ITO ("SITO") sensor substrate, and the like. Sensor substrate 214 may include a glass or plastic substrate or any other suitable material or combinations of materials. Sensor substrate 214 may include any number of row traces (e.g., row traces RA-RZ) that may be formed on a bottom surface 214B of substrate 214 and may run across substrate 214 (e.g., along the X-axis across display opening 209 of housing 101). Moreover, sensor substrate 214 may include any number of column traces (e.g., column traces CA-CZ) that may be formed on a top surface 214T of substrate 214 and may run across substrate 214 (e.g., along the Y-axis across display opening 209 of housing 101). A first end of each trace of a first portion of the row traces (e.g., row traces RA-RM) may be exposed or otherwise accessible at a first substrate region 211 on bottom surface 214B of substrate 214, a first end of each trace of a first portion of the column traces (e.g., column traces CA-CM) may be exposed or otherwise accessible at a second substrate region 213 on top surface 214T of substrate 214, a first end of each trace of a second portion of the column traces (e.g., column traces CN-CZ) may be exposed or otherwise accessible at a third substrate region 215 on top surface 214T of substrate 214, and a first end of each trace of a second portion of the row traces (e.g., row traces RN-RZ) may be exposed or otherwise accessible at a fourth substrate region 217 on bottom surface 214B of substrate 214. As shown in FIGS. 5, 7, and 8, for example, each one of first substrate region 211, second substrate region 213, third substrate region 215, and fourth substrate region 217 of substrate 214 may be positioned just beyond bottom edge 207B of screen 207.

As shown in FIGS. 3-8, for example, a second end of each trace of the first subset of traces of cable 120 at first bond pad region 121 may be electrically coupled to a respective exposed trace of exposed row traces RA-RM at first substrate region 211 on bottom surface 214B of substrate 214. A second end of each trace of the second subset of traces of cable 120 at second bond pad region 123 may be electrically coupled to a respective exposed trace of exposed column traces CA-CM at second substrate region 213 on top surface 214T of substrate 214. A second end of each trace of the third subset of traces of cable 120 at third bond pad region 125 may be electrically coupled to a respective exposed trace of exposed column traces CN-CZ at third substrate region 215 on top surface 214T of substrate 214. A second end of each trace of the fourth subset of traces of cable 120 at fourth bond pad region 127 may be electrically coupled to a respective exposed trace of exposed row traces RN-RZ at fourth substrate region 217 on bottom surface 214B of substrate 214. Each trace of the first, second, third, and fourth subsets of traces of cable 120 may be electrically coupled to a respective trace of a substrate region of substrate 214 via anisotropic conductive film ("ACF"), solder, laser welding, ultrasonic welding, or any other suitable manner.

Figure 3:
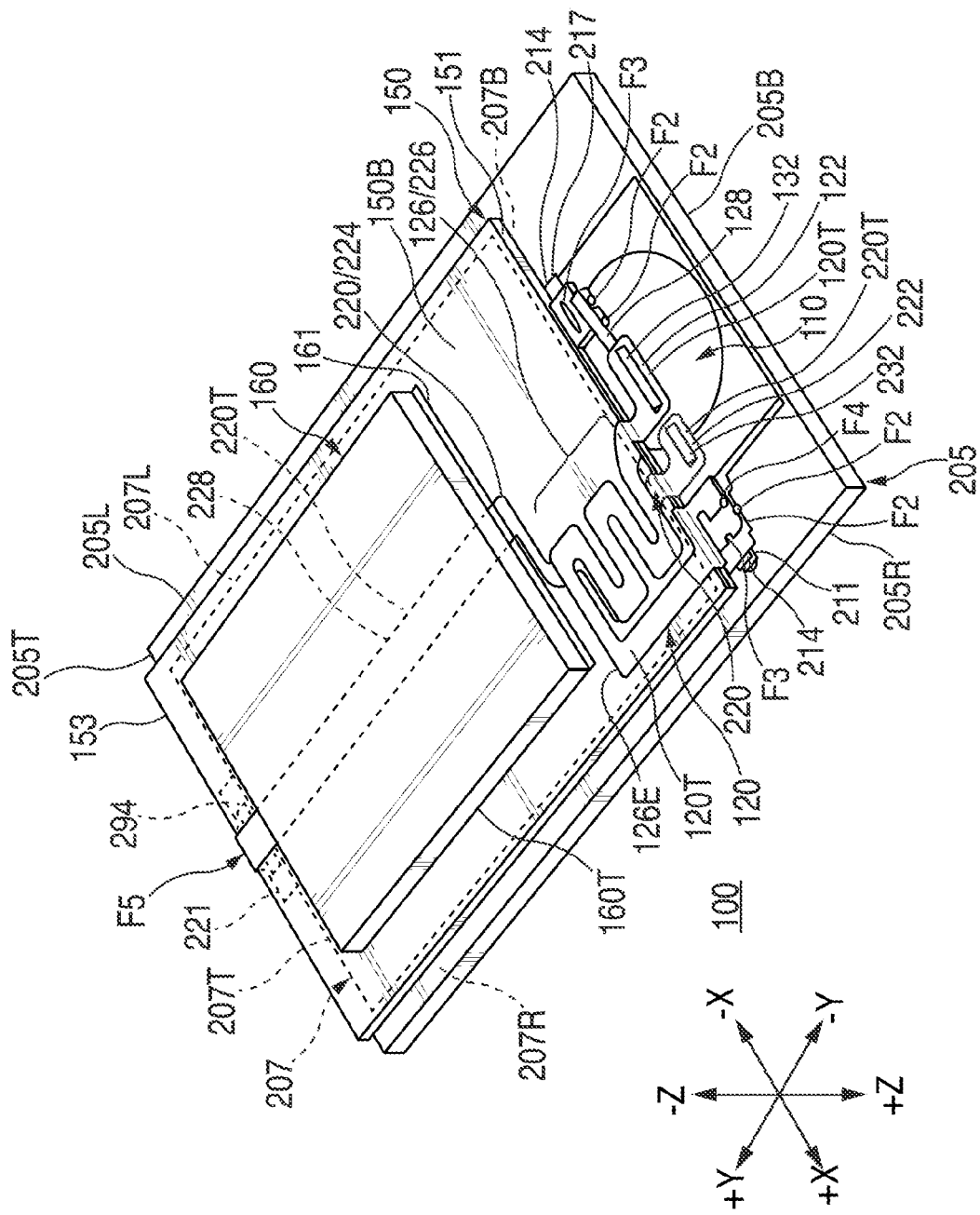
FIG. 3 is a back, bottom, right perspective view of a portion of the electronic device of FIGS. 1 and 2, taken from line III-III of FIG. 2, in accordance with some embodiments of the invention.

As shown in FIGS. 3-8, for example, a switch 119 or any other suitable input component element of first input component 110 may be provided on top surface 120T of cable 120 at fifth bond pad region 129, such that a second end of each trace of the fifth subset of traces of cable 120 at fifth bond pad region 129 may be electrically coupled to switch 119. When fully assembled, as shown in FIGS. 2-4, for example, fifth bond pad region 129 of cable 120 may be aligned with opening 109 through cover 205 (e.g., along the Z-axis), such that switch 119 may be engaged by a mechanical button 118 of first input component 110 that may be positioned at least partially within or under opening 109. For example, switch 119 may be a dome switch or any other suitable mechanism that may be activated or otherwise engaged by mechanical button 118 (e.g., to close or open an electrical circuit) when button 118 is depressed by a user of device 100 in the −Z-direction, through opening 109, towards switch 119.

As shown in FIG. 5, for example, bottom cover length A of cover 205 may be defined by three distinct lengths, such as (1) a button length D of opening 109 for button 118, (2) a top button opening length C1 that may extend between bottom screen edge 207B and a top button point 109T of opening 109 (e.g., the point along opening 109 that is furthest in the +Y-direction), and (3) a bottom button opening length C2 that may extend between bottom cover edge 205B and a bottom button point 109B of opening 109 (e.g., the point along opening 109 that is furthest in the −Y-direction). As shown, sensor substrate 214 may extend in the −Y-direction away from bottom screen edge 207B towards bottom cover edge 205B (e.g., to at least one bottom sensor point 214B (e.g., the point along sensor substrate 214 that is furthest in the −Y-direction)). For example, as shown in FIG. 5, sensor substrate 214 may extend a bottom sensor length T in the −Y-direction away from bottom screen edge 207B to at least one bottom sensor point 214B, which may be located at the bottom edge of one or more of substrate regions 211, 213, 215, and 217. However, in order to reduce bottom cover length A, which may extend between bottom cover edge 205B and bottom screen edge 207B, at least a portion of bottom sensor length T (e.g., along a Y-axis) may overlap with (e.g., may intersect a common X-Z plane as) at least a portion of button length D of opening 109 (e.g., along the Y-axis). For example, as shown in FIG. 5, a portion of bottom sensor length T may overlap with at least a portion of button length D of opening 109 by an overlap length P, which may reduce bottom cover length A by overlap length P, which may reduce overall housing length R of device 100 by overlap length P.

In some embodiments, such that opening 109 may be at least partially overlapped by a portion of substrate sensor 214 to provide overlap length P (e.g., such that an X-Z plane containing each bottom sensor point 214P may intersect opening 109), substrate regions 213 and 215 may be positioned on opposing sides of opening 109. This overlap length P may reduce top button opening length C1 between bottom screen edge 207B and top button point 109T of opening 109. As shown, button opening length C1 may be defined by two distinct lengths, such as (1) a gap length G between top button point 109T of opening 109 and a middle sensor point 214P (e.g., the point along sensor substrate 214 that is closest to top button point 109T), which may be located along an edge of sensor substrate 214 extending between the bottom edges of substrate regions 213 and 215, and (2) a middle sensor length M that may be the shortest length between middle sensor point 214P and bottom screen edge 207B (e.g., at a bottom sensor point SE at bottom screen edge 207B). In order to reduce button opening length C1, which may create overlap length P, middle sensor length M may be reduced. However, in order to reduce middle sensor length M, it may be necessary to reduce the number of traces of substrate 214 that may be extending across middle sensor length M (e.g., between middle sensor point 214P and bottom sensor point SE). For example, rather than having all of the column traces (e.g., column traces CA-CZ) exposed at a single substrate region on top surface 214T of substrate 214 (e.g., such that at least some of the column traces might extend between middle sensor point 214P and bottom sensor point SE bottom screen edge 207B), the first portion of the column traces (e.g., column traces CA-CM) exposed at second substrate region 213 and the second portion of the column traces (e.g., column traces CN-CZ) exposed at third substrate region 215 may be positioned on opposite sides of middle sensor length M (e.g., such that only a few or none of the column traces may extend between middle sensor point 214P and bottom sensor point SE at bottom screen edge 207B). For example, if each one of column traces CA-CZ of substrate 214 were coupled to cable 120 at second substrate region 213, then each one of column traces CN-CZ might extend through middle sensor length M of substrate 214, which might require a larger length C1 then if none of column traces CA-CZ extend through middle sensor length M (e.g., as shown in FIG. 5). In some embodiments, length C1 may be the shortest distance between opening 109 and screen 207.

As shown in FIG. 7, for example, a first fold region F1 may be formed at a first position along cable 120 (e.g., at a portion of cable 120 extending between second cable body portion 128 of body 124 and fifth bond pad region 129), such that cable 120 may be folded at first fold region F1 in the direction of arrow D1 about the X-axis in the +Z-direction. This may allow fifth bond pad region 129 and switch 119 to be folded under a portion of cable 120 (e.g., cable body portion 128) from the first stage of assembly or first arrangement of FIG. 7 to the second stage of assembly or second arrangement of FIG. 8. As shown in FIG. 8, this may allow for at least a portion of fifth bond pad region 129 and switch 119 to at least partially overlap with at least a portion of first end region 122 of cable 120 and connector 132 along the Z-axis. In some embodiments, as shown, a pad 140 (e.g., a stainless steel stiffener) may be positioned on bottom surface 120B of first end region 122 of cable 120, such that it may provide structure and support to cable 120 at connector 132.

Once cable 120 has been folded at first fold region F1, one or more second folds may be made to further arrange cable 120 within device 100. For example, a second fold region F2 may be formed at multiple positions along cable 120 (e.g., at a portion of cable 120 extending between second cable body portion 128 of body 124 and first bond pad region 121, at a portion of cable 120 extending between second cable body portion 128 of body 124 and second bond pad region 123, at a portion of cable 120 extending between second cable body portion 128 of body 124 and third bond pad region 125, and at a portion of cable 120 extending between second cable body portion 128 of body 124 and fourth bond pad region 127), such that cable 120 may be folded at each second fold region F2 in the direction of arrow D2 about the X-axis in the −Z-direction. In some embodiments, cable 120 may be folded at first fold region F1 after cable 120 has been folded at each second fold region F2. Next, once cable 120 has been folded at each second fold region F2, one or more third folds may be made to further arrange cable 120 within device 100. For example, a third fold region F3 may be formed at multiple positions along cable 120 (e.g., at a portion of cable 120 extending between second cable body portion 128 of body 124 and each second fold region F2), such that cable 120 may be folded at each third fold region F3 in the direction of arrow D3 about the X-axis in the −Z-direction.

Then, once cable 120 has been folded at each third fold region F3, at least one component may be positioned over at least a portion of substrate 214. For example, as shown in FIG. 3, a component 150 may extend away from folds F3 in the +Y-direction along housing 101. Each fold region F3 may abut a first end 151 of component 150 (e.g., the end of component 150 that extends the furthest in the −Y-direction). In some embodiments, component 150 may extend between first end 151 and a second end 153 (e.g., the end of component 150 that extends the furthest in the +Y-direction) to provide support for another component of device 100. For example, as shown in FIGS. 4 and 6, support component 150 may provide support for a component 170, which may be positioned between substrate 214 and frame component 150. Component 170 may extend in the +Y-direction from a first end 171 to a second end 173 and may be any suitable device component, such as a display module of display assembly second output component 212 (e.g., an LCD module ("LCM")). In such embodiments, at least a portion of display module 170 may define screen 207 that may be provided upwardly in the +Z-direction through substrate 214 and cover 205. In some embodiments, component 150 may be provided to act as a shield (e.g., an electromagnetic interference ("EMI") shield) for shielding component 170.

Next, once component 150 (and component 170) has been positioned, one or more fourth folds may be made to further arrange cable 120 within device 100. For example, a fourth fold region F4 may be formed at multiple positions along cable 120 (e.g., at a portion of cable 120 extending between first fold region F1 and fifth bond pad region 129, and at a portion of cable 120 where first cable body portion 126 may meet second cable body portion 128 of body 124), such that cable 120 may be folded at each fourth fold region F4 in the direction of arrow D4 about the X-axis in the −Z-direction. As shown in FIGS. 2-8, for example, a first of these fourth fold regions F4 (e.g., at the portion of cable 120 extending between first fold region F1 and fifth bond pad region 129) may allow top surface 120T of cable 120 at fifth bond pad region 129 to be aligned with and facing button opening 109, such that switch 119 may be activated or otherwise engaged by mechanical button 118 of first input component 110 (e.g., to close or open an electrical circuit when button 118 is depressed by a user of device 100 in the −Z-direction, through opening 109, towards switch 119). Moreover, as shown in FIGS. 3-8, for example, a second of these fourth fold regions F4 (e.g., at the portion of cable 120 where first cable body portion 126 may meet second cable body portion 128) may allow first cable body portion 126 of cable 120 to be folded over component 150, such that bottom surface 120B of first cable body portion 126 may run along a bottom surface 150B of component 150 facing the −Z-direction, and such that connector 132 on top surface 120T of cable 120 at first end region 122 may be facing the −Z-direction (e.g., further into housing 101, such that connector 132 may be electrically coupled to another component of device 100 (e.g., processor 102)).

Then, once component 150 has been positioned, and before or after cable 120 has been folded at each fourth fold region F4, at least one component 160 of device 100 may be positioned on bottom surface 150B of component 150. For example, as shown in FIG. 3, a component 160 may extend away from an end 126E of first cable body portion 126 (e.g., the end of cable 120 that extends the furthest in the +Y-direction once cable 120 has been folded at each fourth fold region F4) in the +Y-direction along bottom surface 150B of component 150. End 126E of cable 120 may abut an end 161 of component 160 (e.g., the end of component 160 that extends the furthest in the −Y-direction). In some embodiments, component 160 may include a battery (e.g., a battery of power supply 108) or any other suitable component of device 100.

Therefore, in some embodiments, a mechanical or tactile sensor (e.g., switch 119) of a first input component (e.g., mechanical button input component 110) and a capacitive or resistive sensor (e.g., sensor substrate 214) of a second input component (e.g., touch sensor input component 210 of I/O component 203) may both be electrically coupled to the same cable (e.g., cable 120) and the same connector (e.g., connector 132). This may reduce the space necessary within housing 101 to couple both input component 110 and input component 210 to another component (e.g., a circuit board or processor 102 via a single connector 132) by using only a single cable and only a single connector 132.

In some embodiments, as shown in FIGS. 3, 4, and 6, for example, electronic device 100 may also include a system for routing a second cable within housing 101 and amongst various components of device 100. As shown, device 100 may include a second electrically conducting cable 220 that may provide an electrical connection between two or more electronic components of electronic device 100. For example, cable 220, which may be similar to cable 120, may include one or more wires and may be any suitable type of connector or cable, including, but not limited to, a flexible circuit cable, a coaxial cable, a multi-core cable, a shielded cable, a single cable, a twisted pair cable, a twisting cable, and the like, which may route one or more electrical signals from at least a first electrical component of device 100 to at least a second electrical component of device 100. In some embodiments, cable 220 may be a flexible circuit of any suitable type, such as any flexible printed circuit ("FPC") or any flexible flat cable ("FFC"), including one-sided, double-sided, multi-layer, dual access, rigid-flex, or combinations thereof.

As shown in FIGS. 3, 4, and 6, for example, cable 220 may include a cable body 224 that may extend between a first end region 222 and one or more bond pad regions (e.g., a bond pad region 221). Cable 220 may include a top surface 220T and a bottom surface 220B. Cable body 224 may have a first cable body portion 226 (e.g., a snake body portion 226) and a second cable body region 228. First cable body region 226 may extend between first end region 222 and second cable body region 228, while second cable body region 228 may extend between first cable body region 226 and bond pad region 221. Cable body 224 may also include any number of electrically conductive traces, vias, or wires (not shown) extending therealong between top surface 220T and bottom surface 220B, where at least a first subset of the traces may extend from first end region 222 to first bond pad region 221. A connector 232 may be provided on top surface 220T at first end region 222, such that a first end of each trace of at least the first subset of traces of cable 220 at first end region 222 may be electrically coupled via connector 232 to one or more other components of device 100 (e.g., processor 102). For example, connector 232 may be similar to connector 132, and may be any suitable type of connector, including, but not limited to, a board to board connector, a zero insertion force ("ZIF") connector, a hand or robot solder pad, an anisotropic conductive film ("ACF") bond, and combinations thereof.

As also shown in FIGS. 3, 4, and 6, for example, second output component 212 of touch screen I/O component 203 may be a display assembly that may include a display component, such as LCM display component 170. Display component 170 may include a subcomponent 294, which may be provided at any portion of component 170 (e.g., along a ledge portion 172 of component 170 that may extend in the +Y-direction to end 173 of component 170). For example, display subcomponent 294 may be a driver chip (e.g., an LCD display driver chip, which may drive an LCD display panel (e.g., a display panel of LCM component 170) of second output component 212), as may be described in commonly-assigned U.S. Patent Application Publication No. 2008/0062148, which is hereby incorporated by reference herein in its entirety. In some embodiments, driver chip subcomponent 294 may be provided on ledge portion 172, which may be a thin-film transistor ("TFT") ledge portion of display component 170.

In some embodiments, as shown in FIGS. 2-4, for example, all or at least a portion of subcomponent 294 may be positioned beyond top edge 207T of screen 207 in the +Y-direction (e.g., display subcomponent 294 may extend along and adjacent to top edge 207T of screen 207, between top edge 207T of screen 207 and top wall 101T of housing 101. A second end of each trace (not shown) of at least the first subset of traces of cable 220 at first bond pad region 221 may be electrically coupled to a respective contact (not shown) of subcomponent 294, such that connector 232 at first end region 222 of cable 220 may be electrically coupled to subcomponent 294 at first bond pad region 221 of cable 220. Each trace of at least the first subset of traces of cable 220 may be electrically coupled to a respective contact of subcomponent 294 via anisotropic conductive film ("ACF"), solder, laser welding, ultrasonic welding, or any other suitable manner. As shown, cable 220 may include a fold region (e.g., fold region F5) that may allow cable 220 to extend along bottom surface 150B of component 150 and then fold upwardly about end 153 of component 150 and end 172E of ledge 172 (e.g., in the direction of arrow D5 about the X-axis in the +Y-direction), such that bond pad region 221 may be coupled to subcomponent 294, which may be extending upwardly in the +Z-direction from ledge 172.

In some embodiments, as shown in FIG. 3, for example, when cable 220 is fully assembled within device 100, connector 232 on top surface 220T of cable 220 at first end region 222 may be facing the −Z-direction (e.g., further into housing 101, such that connector 232 may be electrically coupled to another component of device 100 (e.g., processor 102)). Additionally or alternatively, in some embodiments, as shown in FIG. 3, for example, when cable 120 and cable 220 are each fully assembled within device 100, at least a portion of connector 132 on top surface 120T of cable 120 may lie in the same X-Y plane as at least a portion of connector 232 on top surface 220T of cable 220. This may allow connector 132 and connector 232 to each be coupled to a common surface of a single other component of device 100 (e.g., a surface of a circuit board or processor 102). Additionally, in some embodiments, as shown in FIG. 3, for example, when cable 120 and cable 220 are each fully assembled within device 100, at least a portion of connector 132 on top surface 120T of cable 120 may lie along the same X-axis as at least a portion of connector 232 on top surface 220T of cable 220 (e.g., along an X-axis that lies beyond bottom edge 207B of screen 207 in the −Y-direction).

In some embodiments, as shown in FIGS. 3, 4, and 6, for example, when cable 120 and cable 220 are each fully assembled within device 100, at least a portion of first cable body portion 226 of cable 220 may extend along and underneath at least a portion of first cable body portion 126 of cable 120. For example, cable 220 may be positioned within device 100 after component 150 is positioned within device 100 but before cable 120 is folded about fourth fold regions F4, such that the bottom surface of first cable body portion 226 of cable 220 may extend along bottom surface 150B of component 150 and such that bottom surface 120B of first cable body portion 126 of cable 120 may extend along at least a portion of top surface 220T of first cable body portion 226 of cable 220. This may allow at least a portion of first cable body portion 226 of cable 220 to be stacked or sandwiched between bottom surface 120B of first cable body portion 126 and bottom surface 150B of component 150. As shown, the shape of at least a portion of each of first cable body portion 126 and first cable body portion 226 may be similar, such as "S-shaped", which may provide each cable portion with the ability to be stretched concurrently at least partially along the Z-axis. Such concurrent stretching may enable a first end of each one of cables 120 and 220 (e.g., ends 122 and 222 that may be coupled to a circuit board via connectors 123 and 223) to be pulled away in the Z-direction from a second end of each one of cables 120 and 220 (e.g., ends at bond pad regions 111 and 221 that may be coupled to components of I/O component 203 (e.g., substrate 214 and subcomponent 294, respectively)). By providing the matching stretchable portions of cables 120 and 220 in a stacked relationship, the possibility of cables 120 and 220 being tangled when stretched may be reduced.

Moreover, in some embodiments, as shown in FIGS. 3, 4, and 6, for example, when cable 220 is fully assembled within device 100, at least a portion of second cable body portion 228 of cable 220 may extend along and underneath at least a portion of component 160. For example, cable 220 may be positioned within device 100 after component 150 is positioned within device 100 but before component 160 is positioned within device 100, such that bottom surface 220B of second cable body portion 228 of cable 220 may extend along bottom surface 150B of component 150 and such that top surface 220T of second cable body portion 228 of cable 220 may extend along and underneath at least a portion of component 160. This may allow at least a portion of second cable body portion 228 of cable 220 to be sandwiched between bottom surface 150B of component 150 and a top surface 160T of component 160. For example, as shown in FIG. 6, at least a portion of second cable 220 may be sandwiched between bottom surface 150B of component 150 and top surface 160T of component 160, and at least one coupling element 180 may be provided adjacent that portion of cable 220 for physically coupling component 150 to component 160. Each coupling element 180 may be any suitable coupling element, such as pressure-sensitive adhesive ("PSA"). For example, as shown, a first coupling element 180a may extend between bottom surface 150B of component 150 and top surface 160T of component 160 on a first side of cable 220 and a second coupling element 180b may extend between bottom surface 150B of component 150 and top surface 160T of component 160 on a second side of cable 220 for coupling component 150 to component 160 about cable 220. This may allow cable 220 to not affect the Z-height of physically coupled components 150 and 160 within housing 101 (e.g., a thickness T1 of coupling component 180a between components 150 and 160 may be equal to or greater than a thickness T2 of cable 220 between components 150 and 160).

In some embodiments (not shown), cable 120 and cable 220 may be integrated as a single cable, which may have a single first end region (e.g., a combination of end regions 122 and 222) that may be coupled to a single connector (e.g., a combination of connectors 132 and 232), and at least six bond pad regions (e.g., bond pad regions 111, 113, 115, 117, 119, and 221). Such an embodiment may allow for a switch of a mechanical input component 110, a touch assembly of a touch input component 210, and a display assembly of a display output component 212 to all be coupled via the same cable to a single connector for communication with another component of device 110 (e.g., processor 102).

Therefore, in some embodiments, as shown in FIGS. 2-8, a display component 294 (e.g., a display driver chip) of an output component 212 of a touch screen I/O interface 203 may be positioned adjacent a first edge of a display screen 207 of the touch screen I/O interface 203 (e.g., beyond top edge 207T of screen 207 in the +Y-direction), and at least one bond pad substrate region (e.g., at least one of regions 211, 213, 215, and 217) of a touch component 214 of an input component 210 of that same touch screen I/O interface 203 may be positioned adjacent a second edge (e.g., an opposite edge) of that same display screen 207 of the touch screen I/O interface 203 (e.g., beyond bottom edge 207B of screen 207 in the −Y-direction). Yet, despite contacts of these components (e.g., driver chip 294 of component 170 and region 213 of sensor 214) being positioned on opposite ends of screen 207, each one of display component 294 and touch component 214 may be electrically coupled to a connector (e.g., connector 232 and connector 132, respectively) that may be directly coupled to the same additional component of device 100 (e.g., a circuit board or processor 102) at the same location, as each connector may be positioned adjacent to one another (e.g., in the same X-Y plane and/or along the same X-axis).

By having display component 170 oriented about the Z-axis such that subcomponent 294 extends in the +Y-direction away from screen 207 (e.g., such that end 173 of display component 170 extends in the +Y-direction beyond top edge 207T of screen 207), it may increase length B, for example, as shown in FIG. 4. However, if display component 170 were oriented about the Z-axis such that subcomponent 294 might extend in the −Y-direction, it might interfere with the currently shown position of connector 132 and/or switch 119, the resolution of which might increase length A to an even greater length than the currently shown embodiment may increase length B. Moreover, by having display component 170 oriented about the Z-axis such that subcomponent 294 extends in the +Y-direction away from screen 207, at least a portion of component 170 may extend under at least a portion of top housing length H of front housing surface 101F that may extend between top housing surface 101T and opening 209 (e.g., at top cover edge 205T). For example, as shown in FIG. 4, at least a portion of ledge 172 of component 170 may extend a length U under at least a portion of front housing surface 101F to end 172E/173. By nestling this portion of component 170 under such a portion of front housing surface 101F, length B may be reduced.

FIG. 9 is a flowchart of an illustrative process 900, which may include electrically coupling a first bond pad of a cable to at least one electrical contact of a capacitive touch input assembly at a step 902. For example, a first bond pad 121 of cable 120 may be coupled to an electrical contact of sensor 214 at region 211. At step 904, process 900 may include electrically coupling a second bond pad of the cable to at least one electrical contact of a mechanical input assembly. For example, a fifth bond pad 129 of cable 120 may be coupled to an electrical contact of switch 119. At step 906, process 900 may include electrically coupling the first bond pad and the second bond pad to a connector at an end region of the cable. For example, each trace of first bond pad region 121 and each trace of fifth bond pad region 129 may be electrically coupled to connector 132 at end region 122 of cable 120.

It is understood that the steps shown in process 900 of FIG. 9 are merely illustrative and that existing steps may be modified or omitted, additional steps may be added, and the order of certain steps may be altered.

Figure 10:
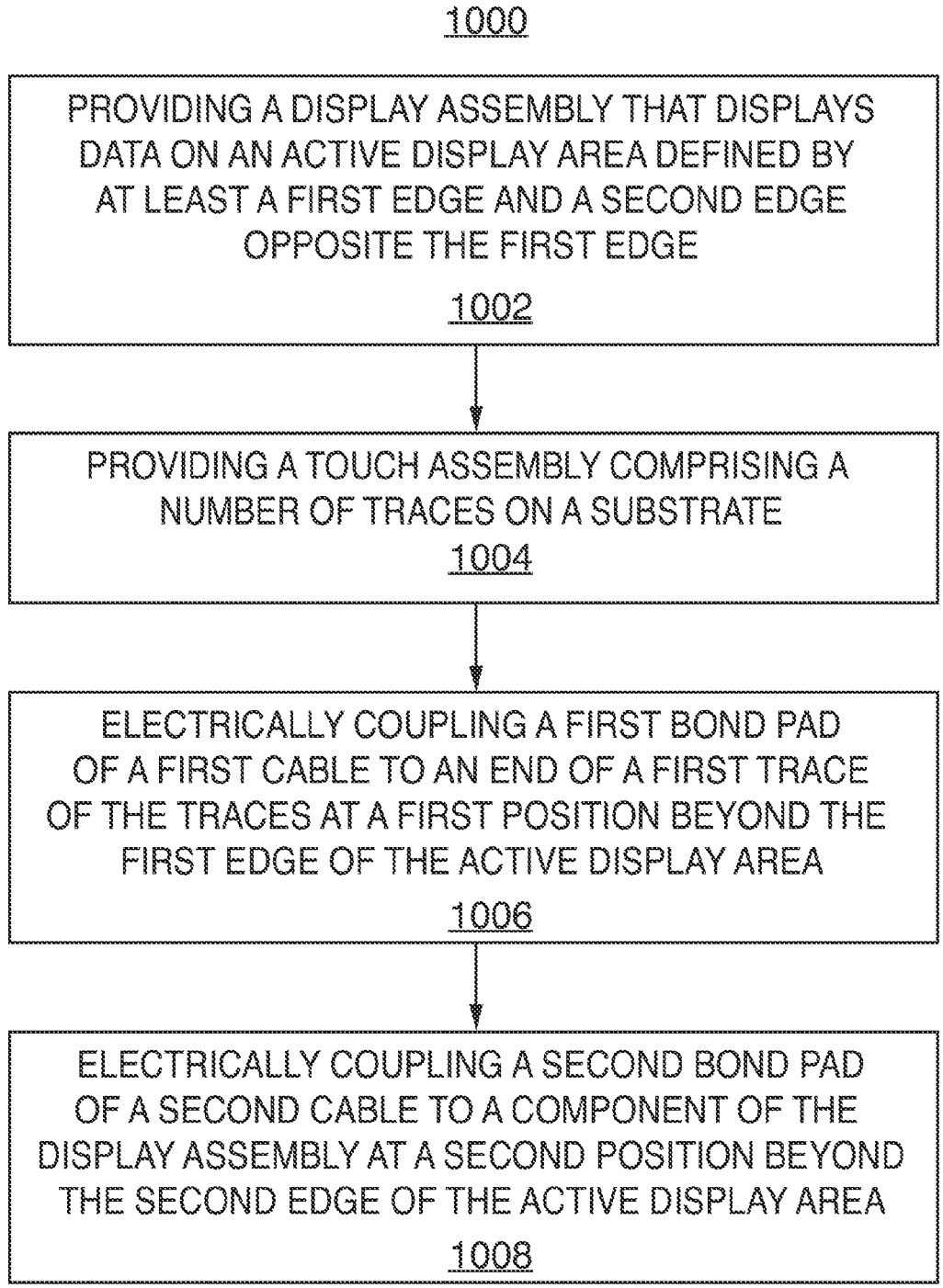
FIG. 10 is a flowchart of an illustrative process for routing cables, in accordance with some embodiments of the invention.

FIG. 10 is a flowchart of an illustrative process 1000, which may include providing a display assembly that displays data on an active display area defined by at least a first edge and a second edge opposite the first edge. For example, display assembly 212 may display data on active display region 207 defined by top edge 207T and bottom edge 207B that may be opposite edge 207T. At step 1004, process 1000 may include providing a touch assembly comprising a number traces on a substrate. For example, a touch input component assembly 210 may include a number of column traces CA-CZ on a substrate 214. At step 1006, process 1000 may include electrically coupling a first bond pad of a first cable to an end of a first trace of the traces at a first position beyond the first edge of the active display area. For example, a bond pad 123 of cable 120 may be coupled to an electrical contact of column trace CM of touch input component assembly 210 at region 213 beyond bottom edge 207B. At step 1008, process 1000 may include electrically coupling a second bond pad of a second cable to a component of the display assembly at a second position beyond the second edge of the active display area. For example, bond pad 221 of cable 220 may be coupled to an electrical contact of component 294 of display assembly 212 beyond top edge 207T.

It is understood that the steps shown in process 1000 of FIG. 10 are merely illustrative and that existing steps may be modified or omitted, additional steps may be added, and the order of certain steps may be altered.

While there have been described systems and methods for routing cables in an electronic device, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements. It is also to be understood that various directional and orientational terms such as "up and "down," "front" and "back," "top" and "bottom" and "side," "length" and "width" and "thickness," "X-" and "Y-" and "Z-," and the like are used herein only for convenience, and that no fixed or absolute directional or orientational limitations are intended by the use of these words. For example, the devices of this invention can have any desired orientation. If reoriented, different directional or orientational terms may need to be used in their description, but that will not alter their fundamental nature as within the scope and spirit of this invention. Moreover, an electronic device constructed in accordance with the principles of the invention may be of any suitable three-dimensional shape, including, but not limited to, a sphere, cone, octahedron, or combination thereof, rather than a hexahedron, as illustrated by FIGS. 1-8.

Therefore, those skilled in the art will appreciate that the invention can be practiced by other than the described embodiments, which are presented for purposes of illustration rather than of limitation.

What is claimed is:
1. An electronic device comprising:
a touch sensor substrate having first and second opposing surfaces and comprising a plurality of traces, wherein a first set and a second set of the plurality of traces are formed on the first surface and wherein a third set of the plurality of traces is formed on the second surface;
an input component; and
a cable comprising:
a first bond pad on the first surface of the touch sensor substrate electrically coupled to the first set of the plurality of traces;
a second bond pad on the first surface of the touch sensor substrate electrically coupled to the second set of the plurality of traces;
a third bond pad on the second surface of the touch sensor substrate electrically coupled to the third set of the plurality of traces;
a fourth bond pad electrically coupled to the input component; and
a connector electrically coupled to each one of the first bond pad, the second bond pad, the third bond pad, and the fourth bond pad.
2. The electronic device of claim 1, wherein the cable comprises a flexible circuit cable.
3. The electronic device of claim 1, wherein the touch sensor substrate comprises a touch screen input component.

4. The electronic device of claim 3, wherein:
the first set of the plurality of traces comprises a first portion of a plurality of column traces of the touch screen input component; and
the second set of the plurality of traces comprises a second portion of the plurality of column traces of the touch screen input component.

5. The electronic device of claim 4, wherein:
the cable further comprises a fifth bond pad electrically coupled to a fourth set of the plurality of traces; and
the connector is electrically coupled to each one of the first bond pad, the second bond pad, the third bond pad, the fourth bond pad, and the fifth bond pad.

6. The electronic device of claim 5, wherein:
the third set of the plurality of traces comprises a first portion of a plurality of row traces of the touch screen input component; and
the fourth set of the plurality of traces comprises a second portion of the plurality of row traces of the touch screen input component.

7. The electronic device of claim 3, further comprising an opening through which the input component is accessible to a user of the electronic device, wherein:
the first bond pad is positioned on a first side of the opening; and
the second bond pad is positioned on a second side of the opening.

8. The electronic device of claim 3, further comprising an opening through which the input component is accessible to a user of the electronic device, wherein a plane perpendicular to the touch sensor substrate extends through the first bond pad, the second bond pad, and the opening.

9. The electronic device of claim 3, wherein the input component comprises a mechanical button input component.

10. The electronic device of claim 1, wherein:
the touch sensor substrate comprises a capacitive touch input component; and
the input component comprises a mechanical input component.

11. An electronic device comprising:
a display assembly for displaying data on an active display area defined by at least a first edge and a second edge opposite the first edge;
a touch assembly comprising a plurality of traces on a substrate;
a first cable comprising:
a first bond pad electrically coupled to at least a first set of the plurality of traces; and
a first connector electrically coupled to the first bond pad; and
a second cable that overlaps the first cable, the second cable comprising:
a second bond pad electrically coupled to a component of the display assembly; and
a second connector electrically coupled to the second bond pad, wherein:
the first bond pad is positioned beyond the first edge of the active display area; and
the second bond pad is positioned beyond the second edge of the active display area.

12. The electronic device of claim 11, wherein:
the first connector is positioned beyond the first edge of the active display area; and
the second connector is positioned beyond the first edge of the active display area.

13. The electronic device of claim 11, wherein a plane parallel to the substrate extends through the first connector and the second connector.

14. The electronic device of claim 13, wherein:
the plane is defined by a first axis and a second axis perpendicular to the first axis; and
the first connector and second connector are linear within the plane along the first axis.

15. The electronic device of claim 11, wherein the touch assembly and the display assembly combine to provide a touch screen display assembly.

16. The electronic device of claim 11, wherein:
the component of the display assembly comprises a driver chip beyond the second edge of the active display area; and
a touch processor of the touch assembly connects to the plurality of traces at the first connector beyond the first edge of the active display area.

17. The electronic device of claim 11, further comprising a housing surface, wherein:
an opening through the housing surface makes the active display area visible to a user of the electronic device, and
the component of the display assembly is positioned underneath the housing surface beyond the opening.

18. The electronic device of claim 11, further comprising a battery, wherein a portion of the second cable extends between a portion of the display assembly and a portion of the battery.

19. The electronic device of claim 18, wherein:
the battery is fixed to the portion of the display assembly by a coupling element;
the coupling element comprises a first thickness extending between the battery and the portion of the display assembly;
the portion of the second cable comprises a second thickness extending between the battery and the portion of the display assembly; and
the second thickness is not greater than the first thickness, such that the portion of the second cable does not affect the distance between the battery and the portion of the display assembly.

20. A method comprising:
electrically coupling a first bond pad of a cable to a first electrical contact of a capacitive touch input assembly;
electrically coupling a second bond pad of the cable to a second electrical contract of the capacitive touch input assembly, wherein the first and second electrical contacts are formed on respective first and second opposing surfaces of the capacitive touch input assembly, wherein the first bond pad is on the first surface, and wherein the second bond pad is on the second surface;
electrically coupling a third bond pad of the cable to at least one electrical contact of a mechanical input assembly; and
electrically coupling the first bond pad, the second bond pad, and the third bond pad to a connector at an end region of the cable.

21. The method of claim 20, wherein:
at least one of the first and second electrical contacts of the capacitive touch input assembly comprises an end of a column trace that extends across a substrate; and
the at least one electrical contact of the mechanical input assembly comprises a tactile switch.

22. The method of claim 20, further comprising:
positioning the third bond pad region between the first bond pad region and the second bond pad region.

23. A method comprising:
providing a display assembly that displays data on an active display area defined by at least a first edge and a second edge opposite the first edge;
providing a touch assembly comprising a plurality of traces on a substrate;
electrically coupling a first bond pad of a first cable to an end of a first trace of the plurality of traces at a first position beyond the first edge of the active display area; and
electrically coupling a second bond pad of a second cable to a component of the display assembly at a second position beyond the second edge of the active display area, wherein the first and second cables overlap.

24. The method of claim 23, further comprising:
positioning a first connector of the first cable at a third position beyond the first edge of the active display area;
positioning a second connector of the second cable at a fourth position beyond the first edge of the active display area; and
connecting the first connector and the second connector to the same component at the third and fourth positions.

\* \* \* \* \*